United States Patent
Delfosse et al.

[11] Patent Number: 5,883,520
[45] Date of Patent: *Mar. 16, 1999

[54] RETENTION OF TEST PROBES IN TRANSLATOR FIXTURES

[75] Inventors: Duane A. Delfosse, Windham; Robert J. Gallagher, Nashua, both of N.H.

[73] Assignee: Star Technology Group, Inc., Nashua, N.H.

[ * ] Notice: This patent issued on a continued prosecution application filed under 37 CFR 1.53(d), and is subject to the twenty year patent term provisions of 35 U.S.C. 154(a)(2).

[21] Appl. No.: 662,671

[22] Filed: Jun. 14, 1996

[51] Int. Cl.⁶ .................................................. G01R 31/02
[52] U.S. Cl. .................................... 324/761; 324/755
[58] Field of Search .................... 324/755, 761, 324/754

[56] References Cited

U.S. PATENT DOCUMENTS

| 4,322,682 | 3/1982 | Schadwill | 324/755 |
| 4,721,908 | 1/1988 | Driller et al. | 324/755 |
| 5,493,230 | 2/1996 | Swart et al. | 324/754 |
| 5,500,606 | 3/1996 | Holmes | 324/761 |
| 5,534,784 | 7/1996 | Lum et al. | 324/755 |

FOREIGN PATENT DOCUMENTS 0149776  7/1985  European Pat. Off. .

*Primary Examiner*—Josie Ballato
*Assistant Examiner*—Russell M. Kobert
*Attorney, Agent, or Firm*—Hayes, Soloway, Hennessey, Grossman & Hage, P.C.

[57] ABSTRACT

A printed circuit board testing fixture employs a preformed plastic screen for retaining the test fixture translator pins.

8 Claims, 2 Drawing Sheets

RETENTION OF TEST PROBES IN TRANSLATOR FIXTURES

FIELD OF THE INVENTION

This invention relates to the automatic testing of printed circuit boards, and more particularly, to "determined" grid test fixtures, in which a translator pin fixture is used for translating electrical current from an off-grid pattern on a board under test to the channels of a tester in which the test channel contacts are arranged in a standard grid pattern. Specifically, the present invention is directed to a test fixture apparatus of the type containing top and bottom base plates with preformed apertures, including a plurality of rigid intermediate guide plates also with preformed apertures, and a plastic screen having a multiplicity of interstitial openings, wherein a plurality of rigid test pins extend through apertures in the plates, openings in the plastic screen, which screen is located between plates of the fixture.

BACKGROUND OF THE INVENTION

Automatic test equipment for checking printed circuit boards has long involved the use of "bed of nails" test fixtures on which the circuit board is mounted during testing. A typical test fixture includes a large number of nail-like spring-loaded test probes arranged to make electrical contact between measurement channels in the test equipment and designated test points on the circuit board under test, also referred to as the unit under test or "UUT". Any particular circuit laid out on a printed circuit board is likely to be different from other circuits, and consequently, the arrangement of test probes for contacting test points on the board must be customized in a test fixture for that particular circuit board. Board design and fabrication data is used to determine what specific board features are to be tested by the fixture. A grid test fixture is typically fabricated by drilling patterns of holes in several rigid and nonconducting plates, assembling those plates with suitable fasteners and spacers to maintain said plates in a parallel, aligned position, and then mounting test pins or probes in the drilled holes. In a "determined" grid test fixture each plate has a hole pattern which is unique such that the test pin can only be inserted to provide an x, y and z translation between a unique feature on the UUT and a unique tester grid channel. In preparation for test, the circuit board is then positioned on the fixture precisely aligned with the array of test probes. During testing, the pins in the fixture are brought into spring-pressure contact with the test points on the circuit board under test. Electrical test signals are then transferred between the board and the tester through the fixture so that a high speed electronic test analyzer which detects continuity or lack of continuity between various test points in the circuits on the board can perform the actual test.

Various approaches have been used in the past for bringing the test probes and the circuit board under test into pressure contact for testing. One class of these fixtures is a "wired" test fixture or a "dedicated" test fixture in which the test probes are individually wired to separate interface contacts for use in transmitting test signals from the probes to the channels of the external electronically controlled test analyzer. These wired test fixtures are often referred to as "vacuum test fixtures" since a vacuum is applied to the interior of the test fixture housing during testing to compress the circuit board into contact with the test probes. Customized wired test fixtures of similar construction also can be made be using mechanical means other than vacuum to apply the spring force necessary for compressing the board into contact with the probes during testing.

The wire wrapping or other connection of test probes, interface pins and transfer pins for use in a wired test fixture can be time intensive. However, customized wired test fixtures are particularly useful in testing circuit boards with complex arrangements of test points and high volume production boards where the higher cost of these fixtures can be amortized.

As mentioned previously, the customized wired test fixtures are one class of fixtures for transmitting signals from the fixture to the external circuit tester. A further class of test fixtures is the so-called "grid type" test fixture, also known as a "determined" fixture, in which the random pattern of test points on the board are contacted by rigid translator pins which transfer test signals to spring loaded interface pins arranged in a grid pattern in the tester. In these grid-type testers, fixturing is generally less complex, components can typically recovered for reuse with other circuit boards and can be produced at lower cost than wired test fixtures; but with a grid system, the grid interfaces and test electronics are substantially more complex and costly. It is the grid-type testers to which the present invention is directed.

A typical tester has thousands of switches and "channels." Each channel has several switches, and is addressable and serves as one coordinate in the "grid." The tester has spring loaded contacts which comprise the grid. The fixture contains rigid translator pins which conduct current from the grid channels to the UUT. In this way, the tester's computer can be made to test continuity and isolation in the UUT through the fixture. When testing a bare board on such a tester, a translator fixture supports and guides pins that conduct between a grid pattern of spring loaded probes in a grid base and an off-grid pattern of test points on the board under test. In one prior art grid fixture so-called "tilt pins" are used as the translator pins. The tilt pins are straight solid pins mounted in corresponding pre-drilled holes in translator plates which are part of the translator fixture.

As mentioned, the fixture typically consists of several parallel translator plates with patterns of drilled holes for retaining a large number of pins extending through the translator plates. The holes drilled in the translator plates are typically drilled with diameters that are slightly oversized with respect to the diameter of the pins, so that the pins easily may be inserted into the holes in the various plates of the translator fixture. Thus, means must be provided for retaining the translator pins in the translator fixture, i.e. so as to prevent the pins from falling out of the fixture if the fixture is lifted up and/or turned upside down without supporting the bottoms of the pins.

There are several prior art approaches to retaining the translator pins in a translator fixture. One approach is described in U.S. Pat. No. 4,721,908. In pertinent part, the '908 patent describes a plurality of test pins disposed in an array plate in accordance with a grid, and a mask plate extending transversely to the test pins and having through bores through which the test pins extend. According to the '908 patent, means are provided for retaining the test pins in parallel alignment in the fixture with the test pins extending through respective through-bores in a mask plate, comprising a relatively stiff elastic plate formed e.g. of a reinforced foam material and mounted at a position spaced from said mask plate and extending parallel thereto. The test pins extend through the elastic plate in a manner such that the elastic material grasps the test pins, whereby the test pins are retained and maintained in parallel alignment due to the elasticity of said material. The '908 patent specification states, for example, at column 3, lines 25–47, that the elastic plate 4, which firmly engages the periphery of the test pins extending therethrough, prevents test pins 2 from dropping from the testing apparatus. The elastic plate described therein is designed to be sufficiently stable while exhibiting the required resistance so that it may be mounted on the apparatus in the manner of a stable plate. The elastic plate is described as comprising a plastic foam cushion such as open-cell polyurethane foam. The pins are pushed through the plastic foam and, in use, the foam cushion naturally applies a compressible lateral retaining force that holds the pins in place. This approach allows use of straight solid pins which have advantages of tighter spacing capabilities, low manufacturing cost, good probe deflection, and bi-directional use of the pins. However, disadvantages of this approach include the fact that the foam deteriorates over time, drag force from the plastic foam cushion reduces the compliancy of the translator pin force, and the foam cushion is unduly stiffened if translator pin density is high. The '908 patent also discloses, but does not claim, an alternative embodiment to the elastic plate, i.e. in which the pin retaining elastic plate comprises an elastic insert in the form of a thin, flexible sheet loosely placed in the space between top and bottom guide plates, both which are aligned with the predetermined basic array grid. (Column 4, lines 26–49).

Another prior art retention system consists of specially formed translator pins in which each pin has a single or multiple longitudinally spaced apart enlarged annular rings that project outwardly around the circumference of the pin. The pins are inserted in the translator fixture when the translator plates are assembled. When assembly of the fixture is completed, the rings on the pins are located inboard from the outer translator plates so that the rings can act as stops in preventing the pins from slipping out of the fixture if the fixture is either lifted up or turned upside down.

In another prior art fixture an enlarged ring at the bottom of the translator pin fits into openings within a two-part bottom plate that captures a lower portion of the pin within holes in the plates that act as stops on both sides of the ring. Both of these fixtures have the disadvantages that the probes are more expensive, probe deflection is reduced, there is added cost to the fixture, the pins are not bi-directional, pin loading time is greater, and the fixture requires disassembly for reconfiguring the pins or for serviceability.

In a more recent approach to the problem, a thin sheet of plastic film such as polyethylene terephthalate (sold under the trademark Mylar) is used as the pin retainer. The Mylar sheet is captured between two translator plates, and undersized holes are drilled in the Mylar sheet in alignment with the larger diameter holes in the translator plates. In addition, undercuts must be formed at specific position(s) in the translator pins, so that when the translator pins are inserted into the fixture, the undercuts are aligned with the undersized holes in the Mylar sheet. The enlarged sections of the pin on opposite sides of the undercut act as stops to prevent the probes from slipping out of the fixture. The undersized holes in the Mylar film act as a retainer and otherwise center the pin in the fixture. The advantage of this approach over the use of the foam cushion is that no lateral drag forces are produced by the Mylar film. However, a disadvantage is that it requires specially formed translator pins with undercuts, which greatly increases manufacturing costs when compared with straight solid pins, because of the requirement of grinding the undercuts in each pin.

The foregoing discussion of the prior art is taken in large part from U.S. Pat. No. 5,493,230, which describes a system for retaining translator pins in a translator fixture that is said to overcome the various disadvantages of the prior art systems described above. Specifically, the '230 patent teaches as a translator pin retention system, a thin rubber pin retention sheet. According to the '230 patent, the thin rubber pin retention sheet comprises a loosely mounted and highly flexible membrane redundant, i.e. formed from an elastomeric material, and has preformed pattern openings for the pins. The elastomeric sheet material is said to retain the pins in the fixture by applying a compressive force around the pins, while the flexibility of the thin sheet allows the pins to move with the retention sheet independently of the other pins and the pin supporting plates in the fixture, and essentially avoids drag forces or any restriction to compliant axial movement of the pins within the fixture.

A disadvantage common to the several prior art fixtures above, is the need to custom predrill the pin retention member, thus adding appreciably to fixture fabrication costs. The present invention provides a pin retention means which does not require custom predrilling. More particularly, the present invention employs a thin, flexible, plastic screen, having a multiplicity of interstitial openings in the mesh of the screen, which screen is located between fixture plates, which is freely movable and unmounted, as the pin retention member.

SUMMARY OF THE INVENTION

In accordance with the present invention, there is provided a translator pin retention system for a translator fixture for a printed circuit board tester of the type having a grid pattern of test channels upon which the translator fixture is mounted, the translator fixture comprising a plurality of essentially parallel and spaced apart rigid translator plates supported in a fixed position in the translator fixture and having selected patterns of holes aligned in the translator plates for containing and supporting translator pins extending through the plates of the translator fixture for positioning the translator pins for contacting test points on the printed circuit board which is supported at one end of the test fixture and for translating electrical test signals between the test points on the printed circuit board through the translator pins to the test channels on the base of the tester, the translator fixture including a plastic pin retention screen positioned between an adjacent pair of said translator plates and positioned to rest loosely adjacent to and unattached to a surface of one of said pair of translator plates in the area of the translator pins so that the translator pins that extend through said pair of translator plates also extend through said plastic pin retention screen, the translator pins comprising straight solid pins, the plastic pin retention screen sheet having a multiplicity of interstitial openings, said openings of sufficient size thereby providing said translating pins an opening for penetration, the plastic properties of the screen further applying a partial compression force around the circumference of the translator pins extending through the screen at a level sufficient to retain the translator pins within the test fixture, the pin retention screen being freely movable independently of the translator plates so that the compression force of the plastic screen acting on the pins essentially avoids applying drag forces or any restriction to axial movement of the pins within the fixture.

BRIEF DESCRIPTION OF THE DRAWINGS

Other objects, features and advantages of the invention and embodiments thereof now will be described in detail below, with reference to the accompanying drawings, wherein like numerals depict like parts, and wherein.

DETAILED DESCRIPTION

Figure 1:
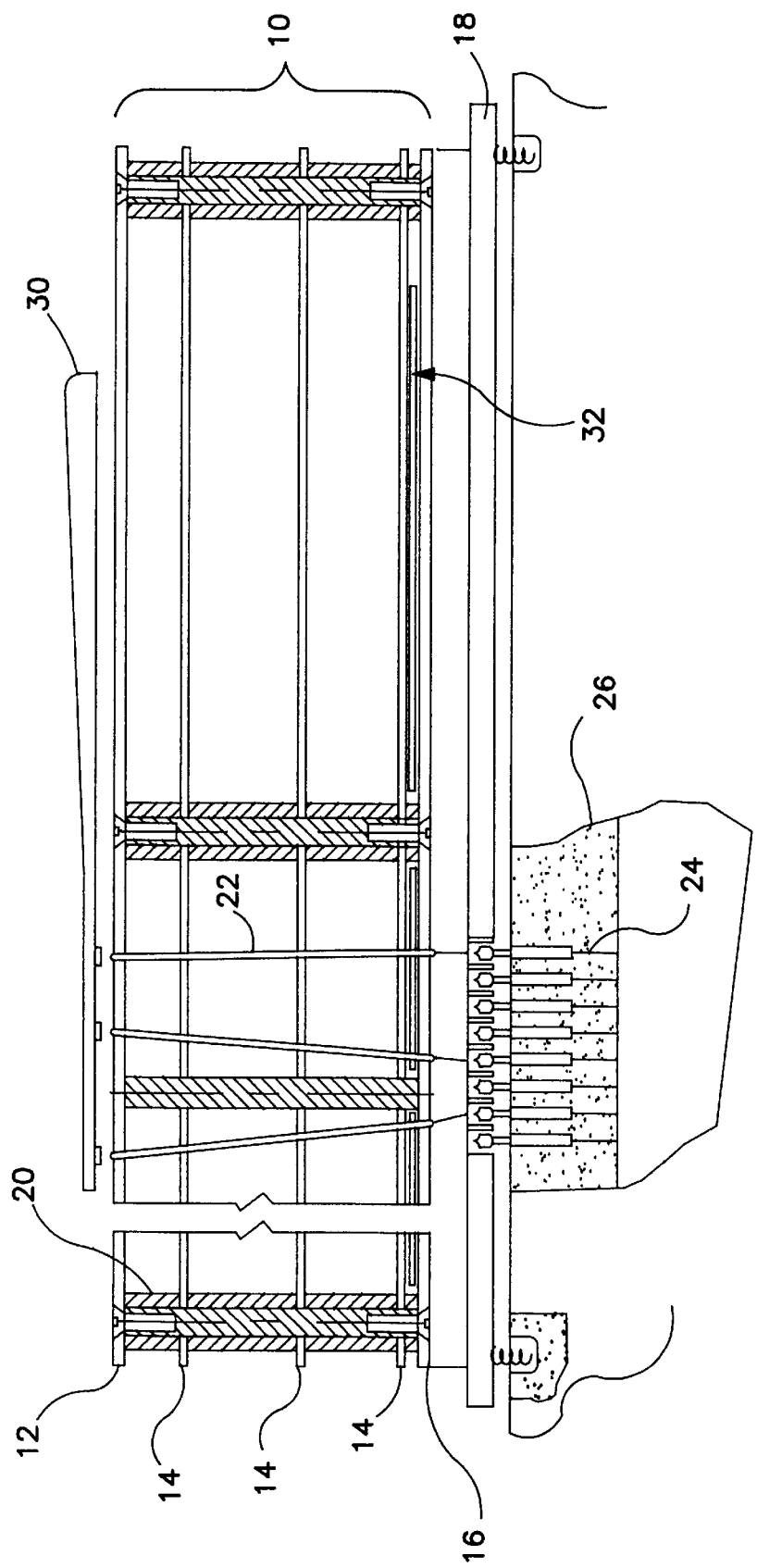
FIG. 1 is a schematic block diagram illustrating components of a grid-type tester and a translator fixture with pin retention means according to the principles of this invention.

With reference to FIG. 1, the present invention comprises a translator fixture 10 which includes a series of spaced apart and parallel translator plates which may include a top plate 12, one or more intermediate plates 14, and a bottom plate 16. The translator plates are supported in parallel vertically spaced apart positions by rigid spacers and fasteners 20 that hold the fixture together as a rigid unit. The fixture also includes an array of standard translator pins, tilt pins represented schematically at 22 extending through holes in translator plates 12, 14, and 16. FIG. 1 illustrates only a few of the standard tilt pins for simplicity. The tilt pins extending through the grid plate 18, typically mounted on the tester in alignment with the grid pattern of spring contacts 24 in the tester assembly 18, 26. The top portion of the tilt pins, which extend through the top plate 12, are in off-grid pattern aligned to match the unique patterns of test points 28 on the unit under test (UUT) 30. Thus, the tilt pins can be tilted slightly and various three-dimensional orientations that can be used in order to translate between the grid pattern at the base and the off-grid pattern at the top. The standard tilt pins pass though holes in the base plate, through holes in the intermediate and upper plates, and through a hole pattern in the top plate, these holes being aligned directly to accommodate a straight test pin. The holes in each of the translator plates are drilled in patterns controlled by standard computer-operated software according to well-known procedures for aligning the tilt pins in the various orientations to translate between the grid patterns at the base and the off-grid pattern at the top. The tilt pins extend through the apertures of a plastic screen 32 that overlies the top face of the grid facing plate of the translator fixture, though this method of pin retention could employ the plastic screen between any two such fixture plates.

The plastic screen 32 provides the means for retaining the pins 22 in the fixture. Screen 32 comprises a preformed screen formed of a plastic mesh material having a multiplicity of interstitial openings 33. Openings 33 have sufficient size to provide an opening for the translating pins 22 to penetrate the screen. Preferably openings 33 are about 0.0005" to 0.020", and the screen has a thickness of about 0.004" to 0.040". A feature and advantage of the present invention is that the screen or mesh openings, by virtue of their size and spacing, allows the pins to establish or seek a suitable penetration point, without the need to predrill the screen.

In addition, as the pin is pushed through the holes in the plastic screen, and without being bound by such theory and explanation, a combination of elastic and inelastic deformation occurs. The elastic portion of the deformation of the screen hole is, in principle, fully recoverable. The inelastic portion, by similar understanding, is non-recoverable. In other words, both an elastic and inelastic response occur in the plastic screen materials of the present invention, and the pin retention screen is freely movable independently of the translator plates so that the compression force of the screen acting on the pins essentially avoids applying drag forces or any restriction to axial movement of the pins within the fixture.

Figure 2:
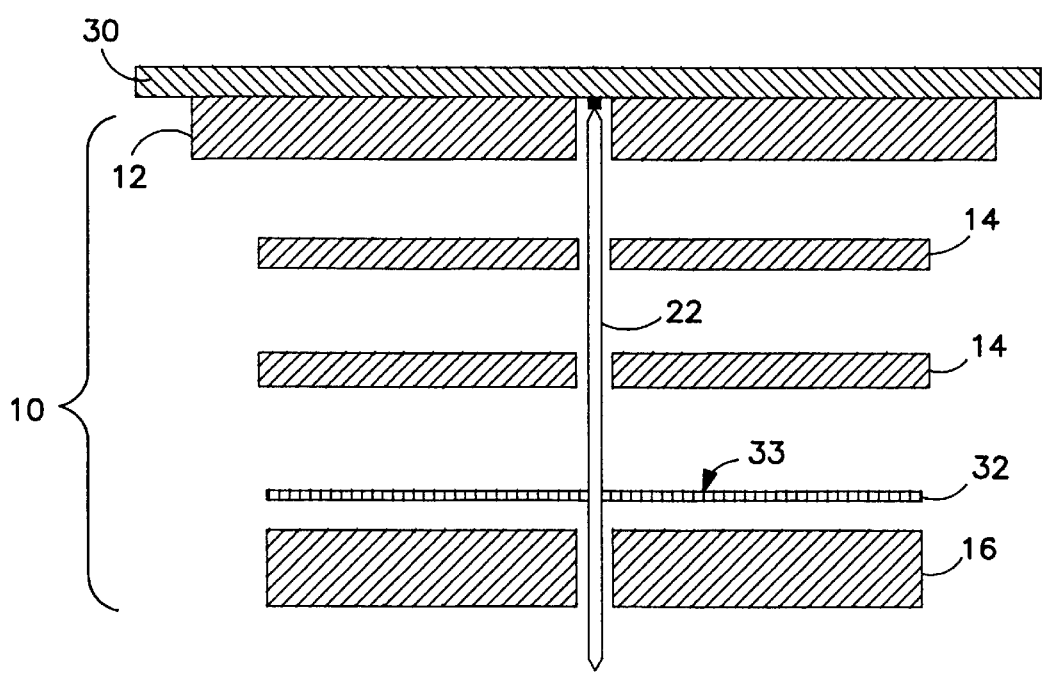
FIG. 2 is a cross-sectional view illustrator translator pin retention screen in a translator fixture.

The pin retention system of the present invention, as further illustrated in FIG. 2, comprises the plastic screen 32 captured between plates, in this case between the grid facing plate (16) and intermediate guide plates (14). Slightly oversized holes are drilled in translator plates 14 and 16. The plastic screen 32 comprises, as illustrated, a multiplicity of openings which provide the translator pins an opening for penetration.

In connection with the above, preferred screen materials include screens made from electrically non-conductive plastic materials such as polyester, polypropylene and/or nylon. Furthermore, such preferred plastic screen materials can be obtained in varying mesh sizes, and with either staggered or on-center arrays of openings. Such screen materials typically are used in industrial screening applications such as filtering or screening fluid process streams, e.g. chemicals, and are available from a number of commercial industrial supply sources which supply polyester, polypropylene and/or nylon screen material in varying roll-stock dimensions.

As will be apparent from the foregoing, the present invention provides several advantages of the prior art. For one, there is no need to drill the unique pin pattern in the retention material. Also, the invention permits the use of straight, low cost pins. Additionally, the invention avoids tightly toleranced guide plate holes and provides free movement of pins in the fixture. And fixtures made in accordance with the present invention enjoy improved serviceability since pins can be easily replaced.

Although the present invention has been described and illustrated with respect to preferred features thereof, it is to be understood that various modifications and changes may be made to the specifically described and illustrated features without departing from the scope of the present invention.

We claim:

1. A translator pin retention system for a translator fixture for a printed circuit board tester having a pattern of test probes facing away from a grid base upon which the translator fixture is mounted, the translator fixture comprising a plurality of essentially parallel and spaced apart rigid translator plates supported in the translator fixture and having selected patterns of holes aligned in the translator plates for containing and supporting translator pins extending through the plates of the translator fixture for positioning the translator pins for contacting test points on the printed circuit board which is supported at one end of the test fixture and for translating electrical test signals between the test points on the printed circuit board and the spring contacts on the grid base of the tester, the translator fixture including a plastic pin retention screen positioned between an adjacent pair of said translator plates and positioned to rest loosely adjacent to and unattached to a surface of one of said pair of translator plates in the area of the translator pins so that the translator pins that extend through said pair of translator plates also extend through said plastic pin retention screen, the translator pins comprising essentially straight solid pins, the plastic pin retention screen being electrically non-conductive, and as initially formed having a multiplicity of integrally preformed interstitial openings which extend from one surface of said screen to an opposite surface of said screen and extend through the entirety of said screen, said openings also being of sufficient size thereby providing said translating pins an opening for penetration, the plastic properties of the screen further applying a partial compression force around the circumference of the translator pins extending through the screen at a level sufficient to retain the translator pins within the test fixture, the pin retention screen being freely movable independently of the translator plates so that the compression force of the plastic screen acting on the pins essentially avoids applying drag forces or any restriction to axial movement of the pins within the fixture.

2. The translator pin retention system of claim 1, wherein the pin retention screen is selected from the group consisting of polyester, polypropylene, nylon, or mixtures thereof.

3. The translator pin retention system of claim 1, wherein the interstitial openings in said pin retention screen sheet are about 0.0005" to 0.020".

4. The translator pin retention system of claim 1, wherein said pin retention screen sheet has a thickness in the range of 0.004" to 0.040".

5. A translator pin retention system for a translator fixture for a printed circuit board tester having a pattern of test probes facing away from a grid base upon which the translator fixture is mounted, the translator fixture comprising a plurality of essentially parallel and spaced apart rigid translator plates supported in the translator fixture and having selected patterns of holes aligned in the translator plates for containing and supporting translator pins extending through the plates of the translator fixture for positioning the translator pins for contacting test points on the printed circuit board which is supported at one end of the test fixture and for translating electrical test signals between the test points on the printed circuit board and the spring contacts on the grid base of the tester, the translator fixture including a plastic pin retention screen positioned between an adjacent pair of said translator plates and positioned to rest loosely adjacent to and unattached to a surface of one of said pair of translator plates in the area of the translator pins so that the translator pins that extend through said pair of translator plates also extend through said plastic pin retention screen, the translator pins comprising essentially straight solid pins, the plastic pin retention screen being electrically non-conductive, and as initially formed having a multiplicity of interstitial openings which extend from one surface of said screen to an opposite surface of said screen and through the entirety of said screen, said openings being of sufficient size thereby providing said translating pins an opening for penetration, the plastic properties of the screen further applying a partial compression force around the circumference of the translator pins extending through the screen at a level sufficient to retain the translator pins within the test fixture, the pin retention screen being freely movable independently of the translator plates so that the compression force of the plastic screen acting on the pins essentially avoids applying drag forces or any restriction to axial movement of the pins within the fixture.

6. The translator pin retention system of claim 5, wherein the pin retention screen is selected from the group consisting of polyester, polypropylene, nylon, or mixtures thereof.

7. The translator pin retention system of claim 5, wherein the interstitial openings in said pin retention screen are about 0.0005" to 0.020".

8. The translator pin retention system of claim 5, wherein said pin retention screen sheet has a thickness in the range of 0.004" to 0.040".

* * * * *